Figure 2A:
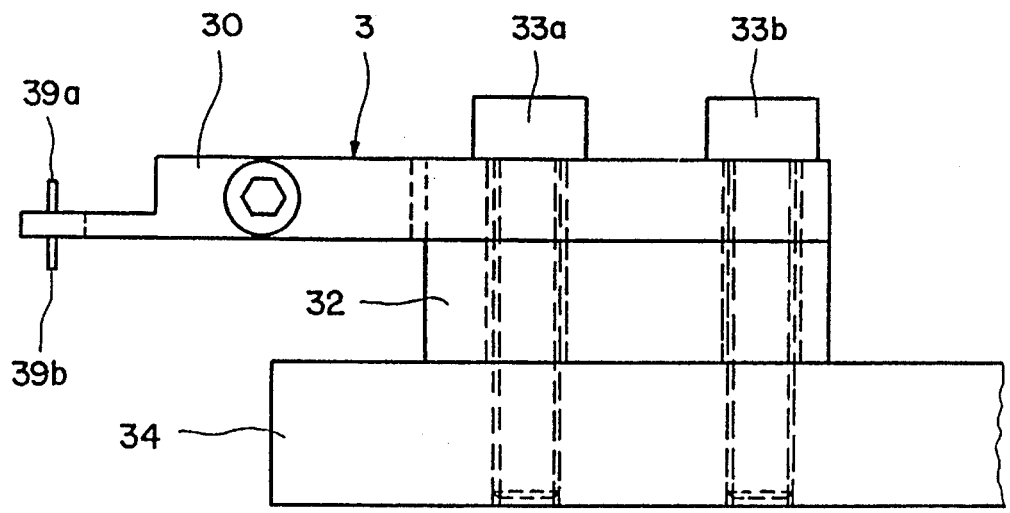

United States Patent [19]
Gustafson

[11] Patent Number: 5,531,390
[45] Date of Patent: Jul. 2, 1996

[54] METHOD OF WINDING A COIL ON A CHUCK HAVING GUIDE PINS

[76] Inventor: Ake Gustafson, Route Champ Thomas, 1618 Châtel-St-Denis, Switzerland

[21] Appl. No.: 293,072

[22] Filed: Aug. 19, 1994

Related U.S. Application Data

[62] Division of Ser. No. 833,370, Feb. 10, 1992, Pat. No. 5,393,001.

[30] Foreign Application Priority Data

Feb. 25, 1991 [CH] Switzerland ................. 552/91

[51] Int. Cl.⁶ .................................................. H01F 41/06
[52] U.S. Cl. ........................................ 242/441.200
[58] Field of Search .................... 242/7.14, 7.03, 242/7.09, 7.13, 7.11

[56] References Cited

U.S. PATENT DOCUMENTS

| | | | |
|---|---|---|---|
| 2,638,278 | 5/1953 | Scott | 242/9 |
| 3,271,839 | 9/1966 | Camardella | 29/33 M |
| 3,865,152 | 2/1975 | Camardella | 140/1 |
| 4,037,072 | 1/1977 | Johnson | 259/56 |
| 4,785,527 | 11/1988 | Bernard et al. | 29/605 |
| 5,240,044 | 8/1993 | Arnold | 140/92.1 |
| 5,261,615 | 11/1993 | Cuttelod | 242/7.02 |
| 5,393,001 | 2/1995 | Gustafson | 242/7.14 |

FOREIGN PATENT DOCUMENTS 3049407  7/1982  Germany.

*Primary Examiner*—Katherine Matecki
*Attorney, Agent, or Firm*—Zarley, McKee, Thomte, Voorhees, & Sease

[57] ABSTRACT

The head (11) of a winding form (1), including two metal paths (12a, 12b), is held between two jaws (30, 31) of the chuck (3). A winding mechanism (40) leads one end of a winding wire (23) above one of the metal paths, being guided by a first guide pin (39a) and a front face (30b) of one of the jaws. After having executed a winding (2) about the core (10) of the winding form, the winding mechanism leads the other end of the winding wire (24) away, passing above the other metal path and being guided by another guide pin (39b; 39c). The chuck used in this way makes it possible to wind fine wire about the core of a very small winding form and to weld the ends of the winding wire to the metal paths without having to go and pick up these ends.

6 Claims, 5 Drawing Sheets

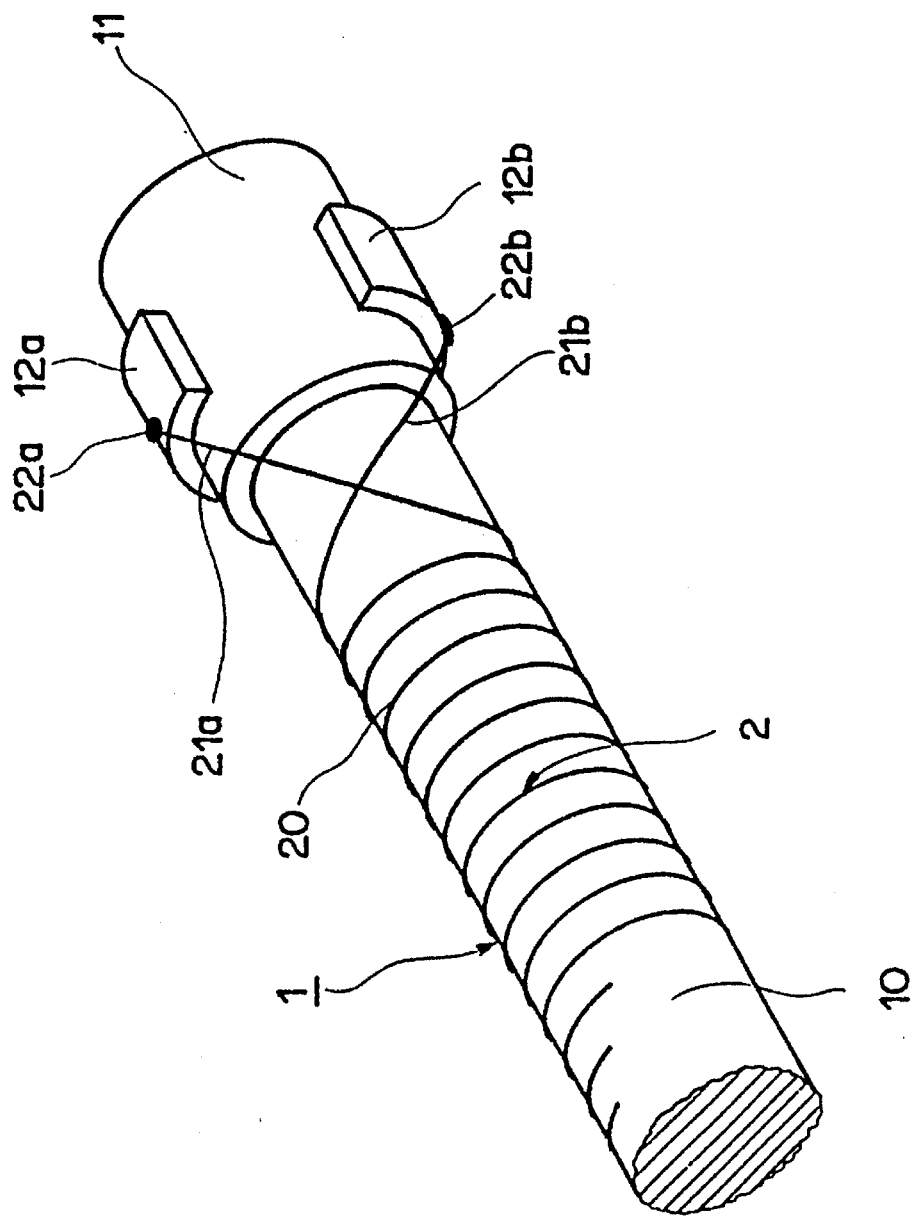

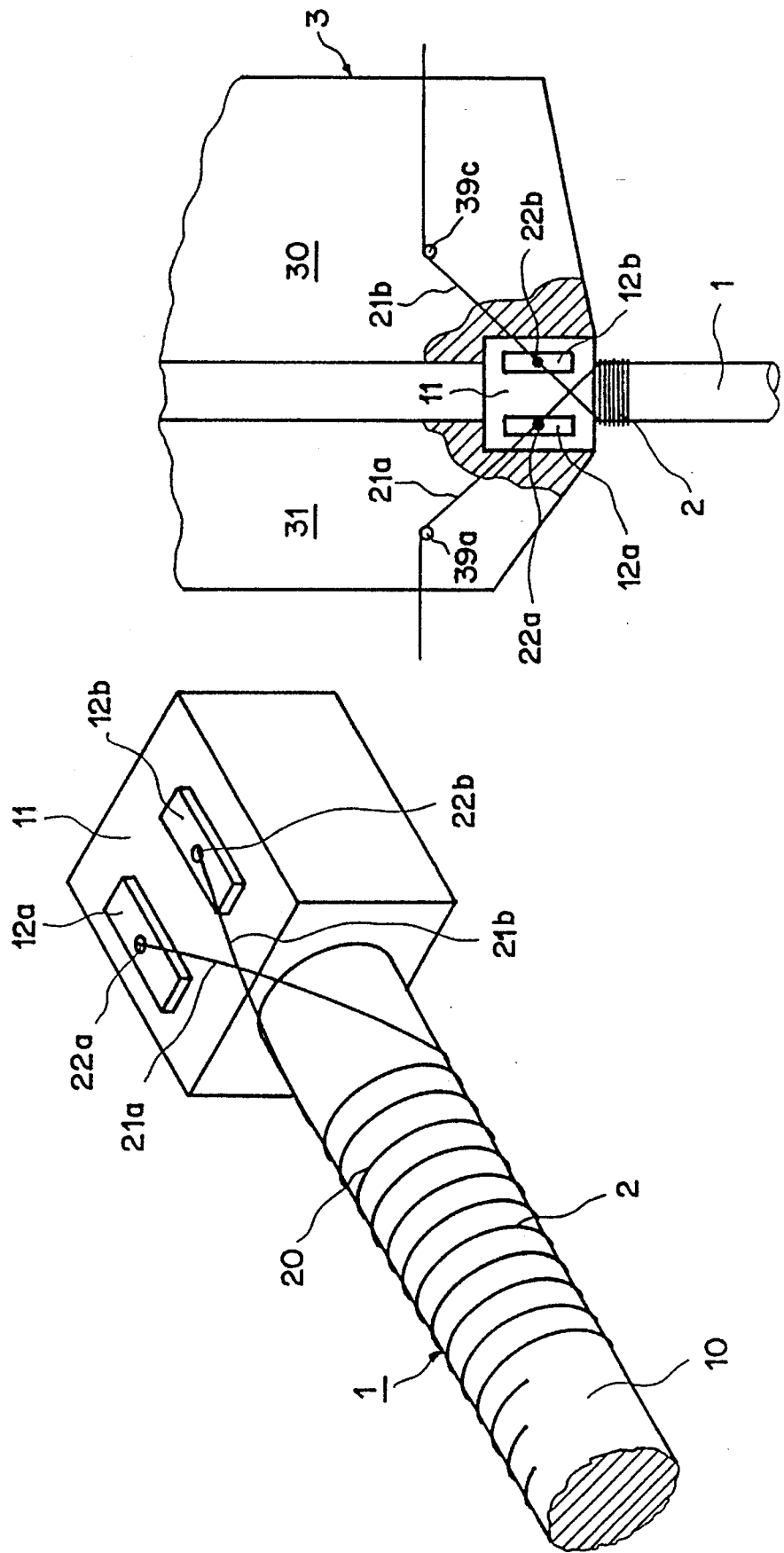

1

METHOD OF WINDING A COIL ON A CHUCK HAVING GUIDE PINS

This is a divisional of application Ser. No. 07/833,370 filed on Feb. 10, 1992, now U.S. Pat. No. 5,393,001, which issued Feb. 8, 1995.

This invention relates to coil winding equipment, and more particularly to a chuck for holding a winding form during winding, a method of utilizing this chuck, and a winding form for carrying out the method.

The winding of small winding forms intended to be used as components of electronic circuits poses numerous problems in that the wire used for winding these forms is extremely fine, and it is necessary to guide it correctly and always to know its position so that it can first be placed on the form to be wound, then wound around the core of this winding form, and picked up at the end of winding to be placed on the next form to be wound, by an automatic winding machine. The difficulty thereupon consists in being able to weld each end of the winding wire to a metal path of the winding form in view of the extremely small size of both the winding wire and the form, i.e., of the core on which it is wound and of the metal paths to which it must be attached.

One solution to this problem is proposed in co-pending U.S. Ser. No. 656,137, describing a method wherein the winding wire remains stretched between points of known positions from which it is always possible to recover it by a suitable means in order to shift it to a required location for welding there. It is nevertheless necessary, with this prior art method, to go after the winding wire in order to bring it into position ready to be welded.

It is an object of this invention to provide an improved chuck, as well as a method of using it and an associated winding form, by means of which this relatively delicate step of going after the wire can be avoided by directly positioning the ends of the wire so that they can at once be welded on suitable metal paths without having to be picked up.

To this end, in the form-holding chuck according to the present invention, the improvement comprises at least one pin for guiding the winding wire, and the jaws of the chuck are shaped in such a way as to give access to at least one metal portion of a head of the winding form.

In the method of operating the inventive chuck, a winding mechanism as a flyer places the winding wire on the first of the metal portions, being guided by the first of the guide pins, as well as by a front face of a chuck jaw adapted as a wire guide, and after winding has been carried out, the winding mechanism takes the winding wire away, passing above the second of the metal portions, being guided by the second of the guide pins.

The winding form for implementing the foregoing method comprises a winding core and at least one head having two metal portions. In the coil produced from the inventive winding form, the two ends of the winding wire are welded to the two metal portions of the head of the winding form.

Figure 2B:
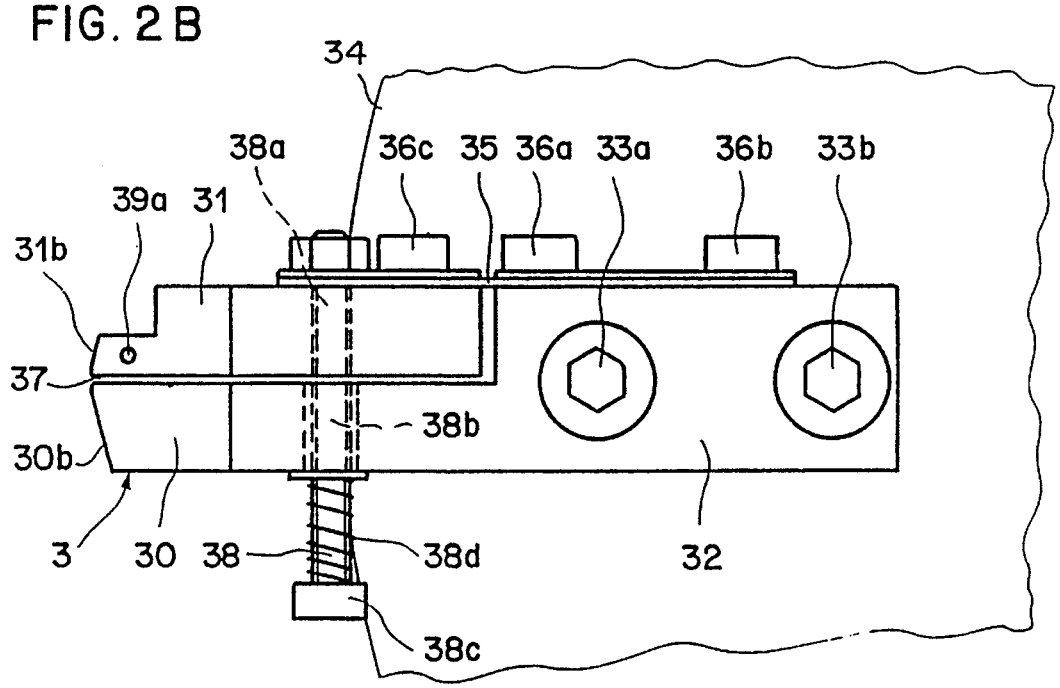
Figure 2C:
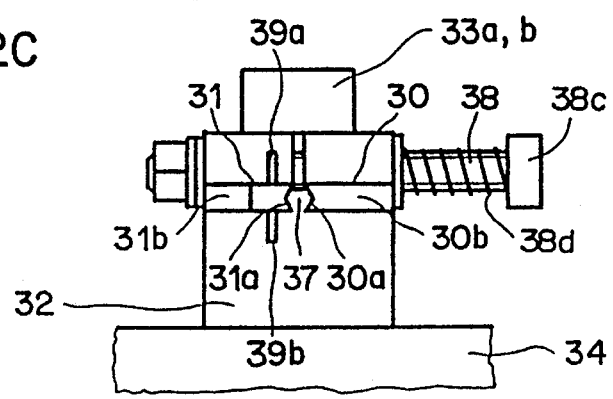
Figure 3A:
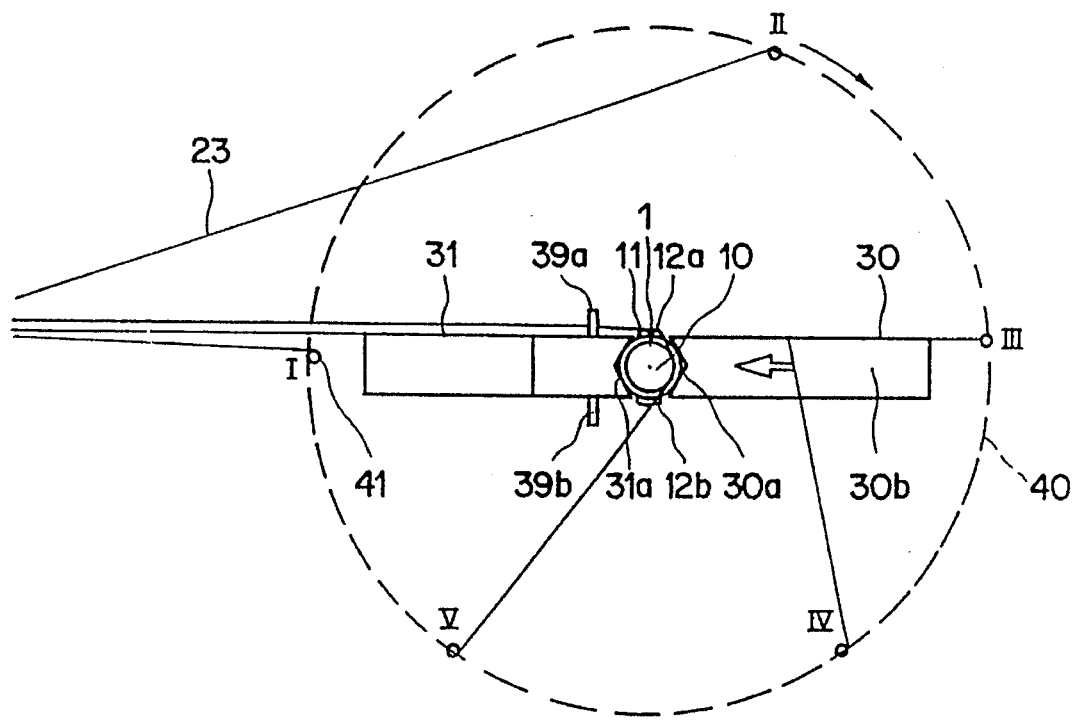
Figure 3B:
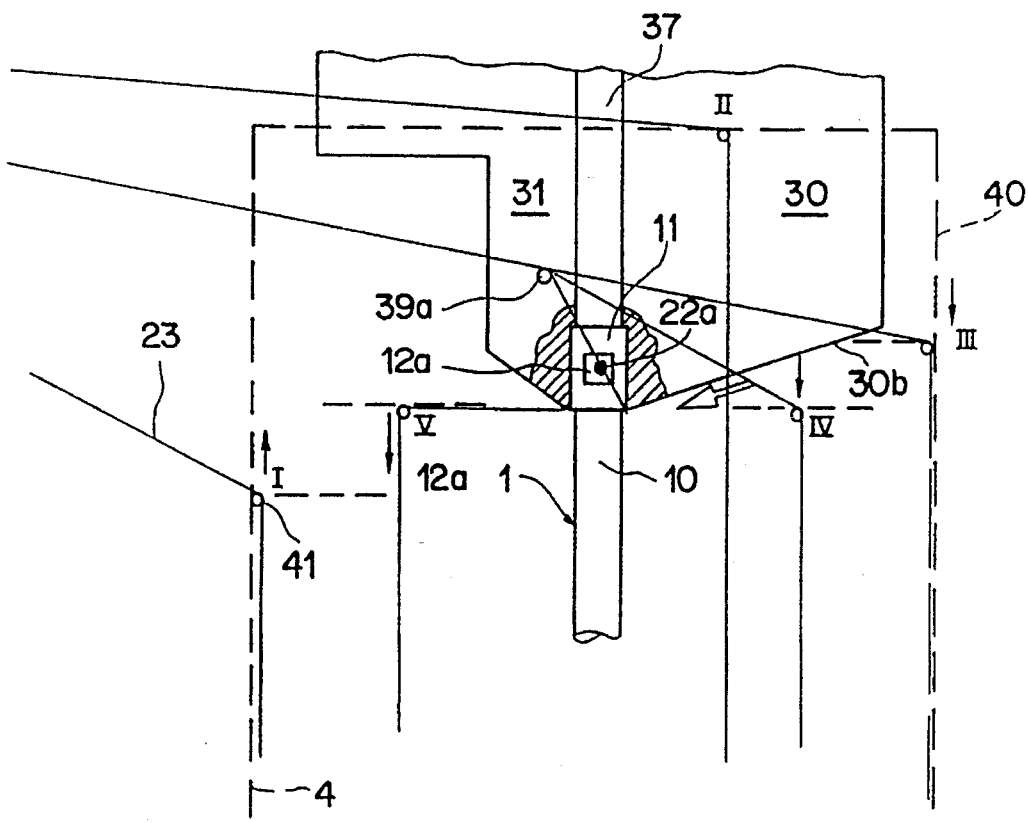
Figure 4A:
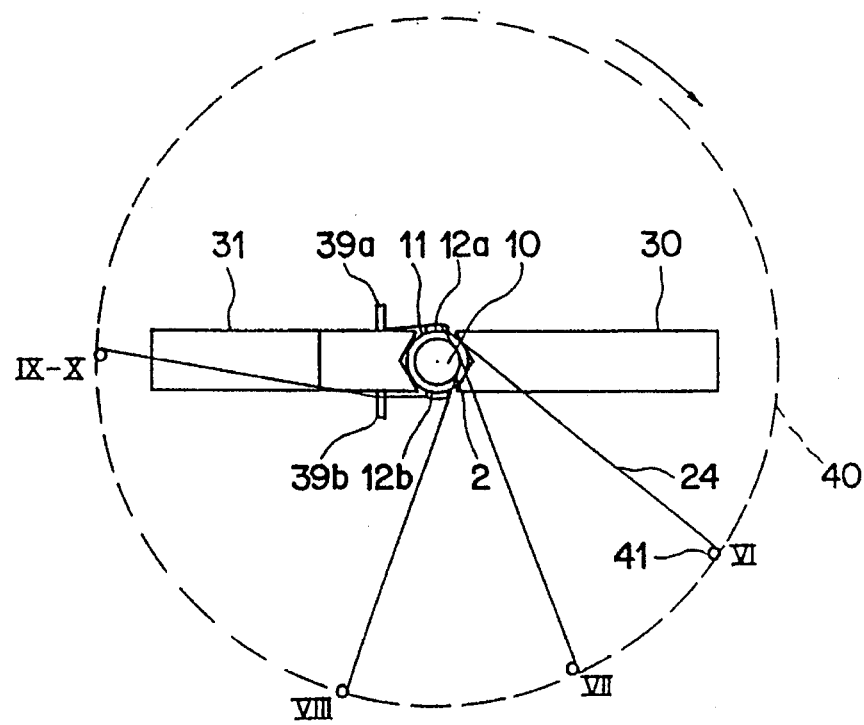
Figure 4B:
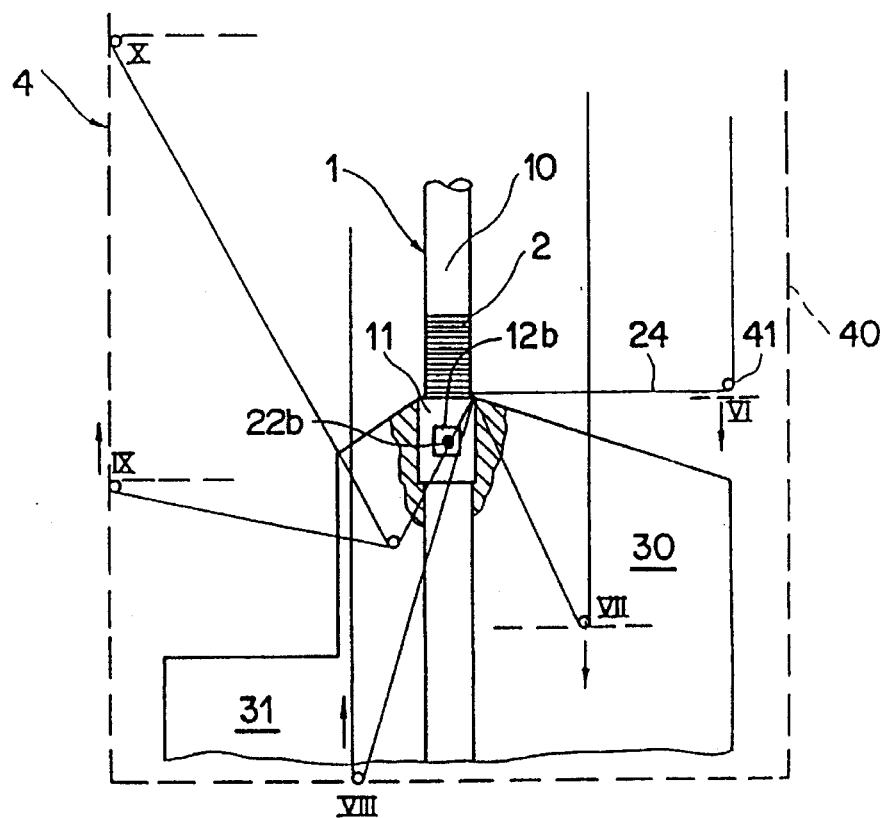

Other objects and advantages of the invention, the make-up and operation of the chuck, the method of utilizing it, as well as the make-up of the winding form and the winding, will become apparent from the following detailed description of preferred embodiments of the invention, taken in conjunction with the accompanying drawings, in which:

FIGS. 1A and 1B are perspective views of part of a winding form and a winding in two respective embodiments of the invention, FIGS. 2A, 2B, and 2C are a top plan view, an elevation, and an end-on view, respectively, of the inventive chuck, FIGS. 3A and 3B are a partial, diagrammatic end-on view and top plan view of the chuck, respectively, illustrating various stages of bringing up the wire prior to winding, FIGS. 4A and 4B are analogous views of the chuck illustrating various stages of the withdrawal of the wire subsequent to winding, and FIG. 5 is a diagrammatic partial elevation of the chuck after withdrawal of the wire subsequent to winding in another embodiment of the inventive winding form.

In order to permit better understanding of the utility of the inventive chuck and method, a description will first be given of the article obtained by means of the chuck and the method, viz., the winding form and the winding according to the invention.

FIG. 1A, a perspective view on a greatly enlarged scale, shows a winding form 1 comprising a core 10, one end of which is provided with a head 11 bearing two metal or metallized paths 12a and 12b. The other end of core 10 (not shown) may take any suitable form, provided or not provided with a head similar to or different from head 11, however, as the case may be, without metal paths. Winding form 1 is preferably of substantially cylindrical shape and circular cross-section, the diameter of head 11 being slightly greater than that of core 10. The dimensions of winding form 1 are extremely small; its total length may be on the order of 5–10 mm and the diameter of core 10 about 0.8 mm, while the diameter of head 11 may be about 1.3 mm and its length about 2 mm. These dimensions are given by way of example, and there is nothing to hinder production of windings according to this invention on smaller or larger winding forms.

Metal paths 12a and 12b are attached in any suitable manner, preferably by cementing, to the outside surface of the cylindrical part of head 11, or they may constitute two metal portions of an electronic circuit, an integrated circuit or a separate electronic component adjoining head 11. The dimensions of these metal paths are less than a millimeter, e.g., 0.6×0.4 mm, and they are so disposed as not to be in contact with one another, preferably on opposite sides of the outer cylindrical surface of head 11. The material used for winding form 1 depends upon the contemplated use of the wound component. It may be metallic or not, magnetic or not; if a conductive body is used, the cement used for attaching metal paths 12a and 12b to head 11 must be insulating.

In another embodiment shown in FIG. 1B, the two metal paths 12a and 12b are not disposed opposite one another on head 11 but, on the contrary, side by side on a head 11 which may also be cylindrical or, as shown in this drawing figure, a parallelepiped.

A winding 2, made up of a plurality of turns of a winding wire 20, is disposed on core 10 of winding form 1 with ends 21a and 21b of the winding wire being welded to metal paths 12a and 12b by spot welds 22a and 22b. Winding wire 20 is preferably copper or aluminum wire insulated by enameling or by varnish and having a very small outside diameter, on the order of some twenty thousandths of a millimeter, for example.

Producing such a winding around such a winding form, as described, is usually very difficult, mainly in view of the small size of both the winding form and the wire, involving numerous problems of manipulating these elements.

FIG. 2A is an elevation, FIG. 2B a top plan view, and FIG. 2C an end-on view of the inventive chuck, suitable for producing a winding on a winding form in the embodiment where the two metal paths 12a and 12b are opposite one another, as illustrated in FIG. 1A. These drawing figures are intended to show the various elements making up the chuck, while its use and operation are described in connection with FIGS. 3 and 4.

In FIG. 2B, the inventive chuck 3 is seen to comprise two jaws 30 and 31. The first jaw 30 is a fixed element composed at the rear of a base 32 serving to secure chuck 3 via two bolts 33a and 33b to a plate 34, which may be the plate of a carousel of an automatic winding machine (not shown). In this case, several of the inventive chucks are disposed on that plate, spaced at regular intervals. The device for securing chuck 3 may be designed in any other suitable manner, just as plate 34 is not necessarily a carousel plate but may instead be a rectangular plate on which several chucks are disposed side by side, or else the base of a single winding station on an appropriate machine.

The second jaw 31 is the movable element of chuck 3; it is connected to fixed jaw 30 by a blade spring 35 held at one end to base 32 by means of two screws 36a and 36b and at the other to movable jaw 31 by a screw 36c. The width of each of the jaws 30 and 31 is such that a space 37 remains between them when blade spring 35 is not biased. A device 38 for opening chuck 3 is disposed thereon; it is composed of a bolt, one end 38a of which is screwed into a threaded bore in part of movable jaw 31, while the shaft 38b of the bolt slides in a bore in part of fixed jaw 30, bolt head 38c being outside at a certain distance from jaw 30.

Thus, when bolt head 38c is pressed, movable jaw 31 moves slightly away from fixed jaw 30 in order to increase the space 37 between these jaws so that an object to be held, e.g., head 11 of winding form 1, may be slipped in between the two inside faces 30a and 31a, as will be explained below. When bolt head 38c is released, springs 35 and 38d return movable jaw 31 to its resting position, thus gripping the object, i.e., head 11 of winding form 1, which has been inserted between the two inside faces 30a and 31a. Although opening device 38 has been described in the foregoing manner, any other device by means of which the two jaws of the chuck may be temporarily separated can be envisaged, e.g., a wedge device or a cam device.

As may be seen in FIG. 2C, the two proximate inside faces 30a and 31a of jaws 30 and 31 are designed to grip and hold an object such as the head 11 of a winding form. If this head 11 is cylindrical, of circular cross-section, and is to be held so that its longitudinal axis constitutes an extension of the chuck, inside faces 30a and 31a will preferably be concave, each formed of two planes intersecting at an obtuse angle. In the case of a head 11 of parallelepiped shape, the shapes of inside faces 30a and 31a will be adapted accordingly. The thickness of the front ends of jaws 30 and 31 corresponds substantially to the diameter of the winding form head to be held, as will be seen below.

Two guide pins 39a and 39b are disposed perpendicular to the principal plane of jaw 30, slightly to the rear of the front face of that jaw, coaxially with one another, one on top of jaw 30 and the other on the bottom. The front faces 30b and 31b of jaws 30 and 31, respectively, are designed in a manner to be described below.

The method of utilizing and operating the inventive chuck will be particularly well understood from FIGS. 3A and 3B, an end-on view and a top plan view of the chuck, respectively. In order that winding form 1 may be better distinguished, both it and the space 37 between the two chuck jaws 30 and 31 are on a greatly enlarged scale as compared with the rest of the chuck. A winding form 1 like the one described above with reference to FIG. 1 has been positioned facing chuck 3, and the head 11 of winding form 1 has been gripped between jaws 30 and 31 as explained earlier. Head 11 is thus held between the two jaws 30 and 31, its longitudinal axis constituting an extension of chuck 3, head 11 being gripped between inside faces 30a and 31a, metal paths 12a and 12b being disposed in space 37—the first 12a visible above and the second 12b below—and core 10 of winding form 1 being flush with the front ends of jaws 30 and 31. Aside from the procedure for opening and closing the jaws of the chuck as described above, the way in which winding form 1 is placed facing chuck 3 and positioned so that head 11 is gripped does not form part of the present invention; the means used may be automatic or manual and need not be further described here.

When head 11 of winding form 1 is held by chuck 3 in the manner explained earlier, it is possible to start the operation consisting in bringing up a winding wire 23 and fabricating winding 2 about core 10. For this purpose, a wire-leading device 4 is provided, made up principally of a winding mechanism 40 comprising a deflection point 41 for keeping winding wire 23 taut between a pay-out reel (not shown), disposed in front of the winding mechanism, and a fixed point (not shown) consisting for the moment of the end of a previously fabricated winding.

FIG. 3A is an end-on view of chuck 3 as seen through winding mechanism 40 from the pay-out reel, winding mechanism 40 being indicated by a broken-line circle representing the area it occupies in the vertical plane, whereas in FIG. 3B chuck 3 is seen from above as if through a "transparent" winding mechanism 40, with the broken line representing the area it occupies in the horizontal plane. In a manner known per se, winding mechanism 40 rotates about its longitudinal axis, clockwise in the embodiment illustrated, and can move longitudinally along the same axis. For passing from one chuck of the carousel plate to another, it is generally the carousel which is rotated, but a lateral translatory motion of the winding mechanism is also possible.

FIGS. 3A and 3B show five successive stages, numbered I–V, of the movement of winding mechanism 40, illustrating the way in which winding wire 23 is brought into position to be wound about core 10.

First, for stage I, chuck 3 has been aligned with the axis of winding mechanism 40 by rotation of carousel plate 34, winding mechanism 40 being in a position withdrawn as far as possible toward the front. Next, winding mechanism 40 moves back to surround chuck 3 while pivoting about its axis in order to arrive in position II, corresponding to the position of maximum retraction of the winding mechanism, in such a way that wire 23 coming from the preceding fixed point is positioned in a vertical plane situated to the rear of upper guide pin 39a (FIG. 3B), this wire passing above the upper end of that guide pin (FIG. 3A). By continuing to pivot and by advancing once more, position II is reached, where wire 23, which has been lowered by the rotation of the winding mechanism, comes to be placed just behind guide pin 39a. Continuing its movements of rotation and advance, winding mechanism 40 brings wire 23 in contact with front face 30b of fixed jaw 30 of chuck 3. Face 30b is cut on the skew so that wire 23 slides along it from position III toward position IV, then position V. Between positions IV and V, the longitudinal advancing movement of winding mechanism 40 is stopped, with only its rotary motion remaining. At V, it is seen that wire 23, having slid along face 30b, has been led to the front end of chuck jaw 30, to the location where winding core 10 begins. It will be noted that between this point and guide pin 39a, the wire is taut and passes directly above metal path 12a disposed on head 11 of winding form 1. Since the thickness of jaws 30 and 31 corresponds to the outside diameter as measured over the two metal paths 12a and 12b, wire 23 is therefore just flush with metal path 12a.

After stage V, the winding mechanism continues to rotate and resumes its longitudinal shifting movement of advance, then of withdrawal, in order to produce winding 2 around core 10, according to the prior art.

FIGS. 4A and 4B show the same device as FIGS. 3A and 3B, FIG. 4A being an end-on view of chuck 3, while FIG. 4B is a bottom view of chuck 3, through a "transparent" winding mechanism 40 as previously.

Five successive stages of winding mechanism 40, numbered VI–X, are illustrated in FIGS. 4A and 4B.

After having carried out the winding 2, the winding mechanism is in position VI, at the end of winding core 10 nearest head 11. A longitudinal displacement of the winding mechanism, accompanied by a rotary motion, brings it to position VII, then VIII, where wire 24 is once more situated above, but in a vertical plane passing behind guide pin 39b. By reversing the direction of longitudinal movement of the winding mechanism and by lowering the wire through rotation of that mechanism, the wire is brought to position IX, where it passes behind guide pin 39b. From that time on, wire 24 remains stretched between the end of winding 2 and guide pin 39b, passing immediately above metal path 12b of head 11. From stage IX on, the winding mechanism ceases its rotary motion and is subjected to forceful withdrawal in order to bring it to X, in such a way as to disengage chuck 3 and winding form 1 completely so that carousel plate 34 (FIG. 2) can pivot and bring up a new chuck and a new winding form to be wound.

It will thus be seen, in view of the method of use described, that the positions of guide pins 39a and 39b on jaw 31 are very important since they determine the route to be followed by the winding wire, and this route must pass above the two metal paths 12a and 12b.

In order to finish the winding, a welding device (not shown), preferably automatic and composed of two welding electrodes, one above metal path 12a and the other below metal path 12b, deposits spot welds 22a and 22b on the respective metal paths. For this purpose, there is no need of seeking or moving the winding wire to be welded as it is already exactly positioned and is in contact with the metal path to which it must be welded.

After the following core has been finished, with the wires welded, thus providing a new fixed point for the subsequent article, it will be possible to withdraw winding form 1 with its winding 2 by tearing off the fine winding wire immediately after the welds.

A chuck 3 suitable for fabricating a winding 2 around a winding form 1 comprising a head 11 having two metal paths 12a and 12b placed side by side thereon is slightly different from that described above, its particularity being shown in FIG. 5.

Inasmuch as metal paths 12a and 12b are side by side, end 21a of the wire arrives at winding 2 and end 21b of the wire leaves that winding on the same side of chuck 3, e.g., above it, as shown in FIG. 5. Thus, guide pin 39b disposed under movable jaw 31 is no longer necessary and is replaced by another guide pin 39c disposed on the top surface of fixed jaw 30, in a position symmetrical with that of pin 39a relative to winding form 1. FIG. 5, which is a top view of chuck 3, shows that wire 21a, which has been led around core 10 in the same way as before to be wound there as indicated above, will be withdrawn from it above chuck 3, passing behind pin 39c, in a manner similar to that previously described. The two end wires 21a, 21b of the winding pass above metal paths 12a, 12b and are therefore ready to be welded there by spot welds 22a, 22b, in the same way as described above.

In order to control the movements of the winding mechanism, whether its rotation or the various longitudinal movements described, a control device (not shown) is incorporated in the automatic winding machine. This control device may be mechanical or, preferably, electronic. By Using the inventive chuck and method, controlling the movement of the winding mechanism is simplified to the extent that, besides its rotary motion, the winding mechanism moves only longitudinally and effects no transverse movements relative to the chuck, with the possible exception of its passage from one chuck to another.

Various modifications of the winding form, the chuck, and the method may be envisaged as need be. In particular, it is not absolutely necessary for the inventive chuck to be associated with a winding mechanism for depositing the wire; the chuck may then be arranged to pivot about the axis of the core in order to carry out winding, the device for paying out the wire then being fixed, and the relative advancing and retracting movements between the chuck and the payout device being applied to one or the other of these two elements or being a combination of movements of such elements. In this case, both the incoming wire 21a and the outgoing wire 21b must be held by chuck 3 before pin 39a and after pin 39b or 39c, as the case may be, by a suitable device known per se. As has been seen above, the head of the winding form is not necessarily cylindrical; the same applies to the core, which may likewise have any desired cross-section.

Additionally, it may not be necessary for both ends of the winding wire to be joined to metal paths on the head of the winding form but rather for one of them to be picked up later on for some suitable connection; in that case, the head of the winding form will include only one metal path, and the chuck may then comprise only one guide pin, only the first steps of the method being used. In that case, the part of the winding wire end not immediately welded might be held by a device such as described in the initially mentioned co-pending application U.S. Ser. No. 656,137.

By means of the inventive chuck and the inventive method for utilization of that chuck, it is very easy automatically to produce the inventive windings of fine wire on the inventive winding forms, of extremely small dimensions, without its being necessary to pick up the ends of the winding wire in order to weld them to suitable metal paths.

What is claimed is:

1. A coil-winding method utilizing a chuck having two jaws for holding a winding form having a head including at least one metal portion during winding of a winding wire about the winding form, the chuck comprising a plurality of guide pins for guiding the winding wire, and the jaw of the chuck being shaped in such a way as to give access to the at least one metal portion of the head of the winding form and having at least one front face thereof adapted to act as a wire guide, and a winding mechanism, comprising the steps of:

a.) leading the winding wire by relative movement between said chuck and said winding mechanism onto one of the metal portions, the winding wire being guided by one of the guide pins and by said front face;

b.) execution of the winding by relative rotational movement between said chuck and said winding mechanism; and c.) leading the winding wire away by relative movement between said chuck and said winding mechanism, the winding wire being guided by another of the guide pins to pass over another of the metal portions.

2. The method of claim 1, wherein the winding form has a longitudinal axis and the winding mechanism moves only parallel to the longitudinal axis of the winding form during the relative movement of the steps a.) through c.).

3. The method of claim 2, wherein a coil-winding machine having a plurality of said chucks is utilized, each of said chucks holding a respective winding form, steps a.) through c.) being performed on a first winding form held in a first chuck, then the winding wire being led to another of the winding forms on the same coil-winding machine and steps a.) through c.) being repeated.

4. The method of claim 1, comprising the further step of d.) causing the chuck to pivot about a longitudinal axis of the winding form.

5. The method of claim 4, wherein a coil-winding machine having a plurality of said chucks is utilized, each of said chucks holding a respective winding form, steps a.) through d.) being performed on a first winding form held in a first chuck, then the winding wire being led to another of the winding forms on the same coil-winding machine and steps a.) through d.) being repeated.

6. The method of claim 1, wherein the winding form has a longitudinal axis and the winding mechanism only moves in a circular path with respect to the longitudinal axis of the winding form during the relative movement of the steps a.) through c.).

* * * * *